(12) United States Patent
Gavini et al.

(10) Patent No.: US 10,255,383 B2
(45) Date of Patent: Apr. 9, 2019

(54) RULE BASED THREE-DIMENSIONAL (3D) INTERSECTION MODEL

(71) Applicant: Autodesk, Inc., San Rafael, CA (US)

(72) Inventors: Chakravarthy Gavini, Amherst, NH (US); Li Huang, Shanghai (CN); Tao Liu, Shanghai (CN); Guang Han, Shanghai (CN); Yabin Xiao, Shanghai (CN); Ming Chong, Shanghai (CN); Wei Huang, Shanghai (CN); Haibo Wang, Shanghai (CN); Christopher Eric Putnam, Manchester, NH (US); Qiang Wu, Shanghai (CN)

(73) Assignee: AUTODESK, INC., San Rafael, CA (US)

( * ) Notice: Subject to any disclaimer, the term of this patent is extended or adjusted under 35 U.S.C. 154(b) by 543 days.

(21) Appl. No.: 14/872,907

(22) Filed: Oct. 1, 2015

(65) Prior Publication Data

US 2016/0103936 A1    Apr. 14, 2016

Related U.S. Application Data

(60) Provisional application No. 62/062,586, filed on Oct. 10, 2014.

(51) Int. Cl.
*E01C 1/00* (2006.01)
*G06F 17/50* (2006.01)
(Continued)

(52) U.S. Cl.
CPC ............ *G06F 17/5004* (2013.01); *E01C 1/00* (2013.01); *G06T 17/05* (2013.01); *G06T 17/10* (2013.01); *G06T 17/20* (2013.01)

(58) Field of Classification Search
CPC ......... G06T 17/05; G06T 17/10; G06T 17/20; G06F 17/5004
See application file for complete search history.

(56) References Cited

U.S. PATENT DOCUMENTS

| 8,983,803 B2 * | 3/2015 | Sen .................. G06F 17/50 703/1 |
| 2007/0080961 A1 * | 4/2007 | Inzinga .............. G06T 17/05 345/419 |

(Continued)

FOREIGN PATENT DOCUMENTS

| CN | 102436678 B | * | 2/2012 |
| JP | 2000047573 | * | 2/2000 |

OTHER PUBLICATIONS

"MaineDOT MicroStation & InRoads Procedures." Maine DOT (Aug. 2012), Chapter 17 [retrieved on Oct. 30, 2017]. Retrieved from <http://www.maine.gov/mdot/caddsupport/docs/msinroads/MDOTInRoadsManualv8i.pdf> (Year: 2012).*

(Continued)

*Primary Examiner* — Aniss Chad
*Assistant Examiner* — Alfred H B Wechselberger
(74) *Attorney, Agent, or Firm* — Gates & Cooper LLP

(57) ABSTRACT

A method, apparatus, system, and computer program product provide the ability to design a road intersection in a three-dimensional (3D) modeling and visualization system. Two roads are defined in the system with the second road intersecting the first road. A set of design rules (that define characteristics of use that contribute to a shape of the road intersection) is acquired. Based on the set of rules, a 3D model of the road intersection is directly created. A property of one of the roads is modified. Without additional user input, the 3D model of the road intersection is automatically and dynamically updated based on the modified property (Continued)

and while maintaining conformance with the set of design rules.

14 Claims, 6 Drawing Sheets

(51) Int. Cl.
*G06T 17/05* (2011.01)
*G06T 17/10* (2006.01)
*G06T 17/20* (2006.01)

(56) References Cited

U.S. PATENT DOCUMENTS

| | | | | |
|---|---|---|---|---|
| 2008/0298891 | A1* | 12/2008 | Boucherat | G06F 17/5004 404/1 |
| 2011/0295564 | A1* | 12/2011 | Chazal | G06F 17/50 703/1 |
| 2014/0244067 | A1* | 8/2014 | Filev | G06F 17/00 701/1 |
| 2015/0285654 | A1* | 10/2015 | Kogler | G01C 21/3635 701/409 |
| 2016/0147915 | A1* | 5/2016 | Pope | G06F 17/5004 703/1 |

OTHER PUBLICATIONS

"FDOT Corridor Modeling." CE-11-0135 [course guide], Florida DOT (Feb. 2014), Chapter 11 [retrieved on Oct. 30, 2017]. Retrieved from <http://www.fdot.gov/cadd/downloads/documentation/FDOTCorridorModeling/Files/FDOTCorridorModeling.pdf> (Year: 2014).*
Fitzpatrick, et al. "Urban Intersection Design Guide: vol. 1—Guidelines." FHWA/TX-05/0-4365-P2 vol. 1 [technical report], Texas DOT (Feb. 2005), Chapters 1-5 [retrieved on Oct. 31, 2017]. Retrieved from <https://static.tti.tamu.edu/tti.tamu.edu/documents/0-4365-P2.pdf> (Year: 2005).*
"A Policy on Geometric Design of Highways and Streets." 4th Edition, American Association of State Highway and Transportation Officials (2001), Chapter 9 [retrieved on Oct. 31, 2017]. Retrieved from <https://nacto.org/docs/usdg/geometric_design_highways_and_streets_aashto.pdf> (Year: 2001).*
"AutoCAD Civil 3D 2010 User's Guide." [user's guide] Autodesk (2009), p. 8, 25-32, 38-40, 47-48, 76, 1019-1021, 1712-1713, 1939-1956 and Chapter 32 [retrieved on Oct. 31, 2017]. Retrieved from <http://images.autodesk.com/adsk/files/civil3d_ug.pdf> (Year: 2009).*
"AutoCAD Civil 3D 2011 Tutorials." [tutorial] Autodesk (2010), pp. 248-261 and 495-538 [retrieved on Oct. 31, 2017]. Retrieved from <http://images.autodesk.com/adsk/files/civil_tutorials0.pdf> (Year: 2010).*
"Florida Intersection Design Guide 2014." [design guide] Florida DOT (2014), Chapter 2 and 3 [retrieved on Oct. 30, 2017]. Retrieved from <http://www.fdot.gov/roadway/fidg-manual/FIDG2014.pdf> (Year: 2014).*
Ferraris et al. "A Rule-based Approach to 3D Terrain Generation via Texture Splatting" ACE '09 Proceedings of the International Conference on Advances in Computer Enterntainment Technology, pp. 407-408 [retrieved on Oct. 16, 2018]. Retrieved from <https://dl.acm.org/citation.cfm?id=1690474> (Year: 2009).*
Wang et al. "Automatic high-fidelity 3D road network modeling based on 2D GIS data" Advances in Engineering Software, vol. 76, pp. 86-98 [retrieved on Oct. 19, 2018]. Retrieved from <https://www.sciencedirect.com/science/article/pii/S096599781400101X> (Year: 2014).*
Bi-song et al. "A 3-Dimensional modeling method of complex and enormous cloverleaf junction" Science of Surveying and Mapping [retrieved on Oct. 19, 2018]. Retrieved from <http://en.cnki.com.cn/Article_en/CJFDTOTAL-CHKD200801034.htm> (Year: 2008).*
Autodesk, Inc., "AutoCAD Civil 3D 2010—User's Guide", Apr. 2009, Chapter 32 "Intersections", pp. 1443-1482.

* cited by examiner

RULE BASED THREE-DIMENSIONAL (3D) INTERSECTION MODEL

CROSS-REFERENCE TO RELATED APPLICATIONS

This application claims the benefit under 35 U.S.C. Section 119(e) of the following commonly-assigned U.S. provisional patent application(s), which is/are incorporated by reference herein:

Provisional Application Ser. No. 62/062,586, filed on Oct. 10, 2014, by Chakravarthy Gavini, Li Huang, Tao Liu, Guang Han, Yabin Xiao, Ming Chong, Wei Huang, Haibo Wang, Christopher Putnam, and Qiang Wu, entitled "Rule Based 3D Intersection Model".

BACKGROUND OF THE INVENTION

1. Field of the Invention

The present invention relates generally to road design, and in particular, to a method, apparatus, and article of manufacture for designing three-dimensional (3D) road intersections.

2. Description of the Related Art

The process of connecting roads, or creating intersections (e.g., in a 3D civil engineering/infrastructure design system) is currently a very manual process. More specifically, once roads are created, a junction must be manually created, selected, and modified in order to meet design standards. In other words, the road themselves have to be connected using intersections. Thereafter, the user must manually define the particular intersection/type of intersection. There exists a need for a simple, practical way of creating such intersections.

SUMMARY OF THE INVENTION

Embodiments of the invention solve the problem of creating intelligent rule-based 3D intersections to meet the requirements of design vehicles from standards at model creation time to improve efficiency and avoid design changes at an early stage. In other words, a set of rules are automatically utilized to define/design an intersection that is most suitable to the design conditions. In addition, junctions/intersections may be designed/modified based on a type of vehicle that may utilize the junction/intersection.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
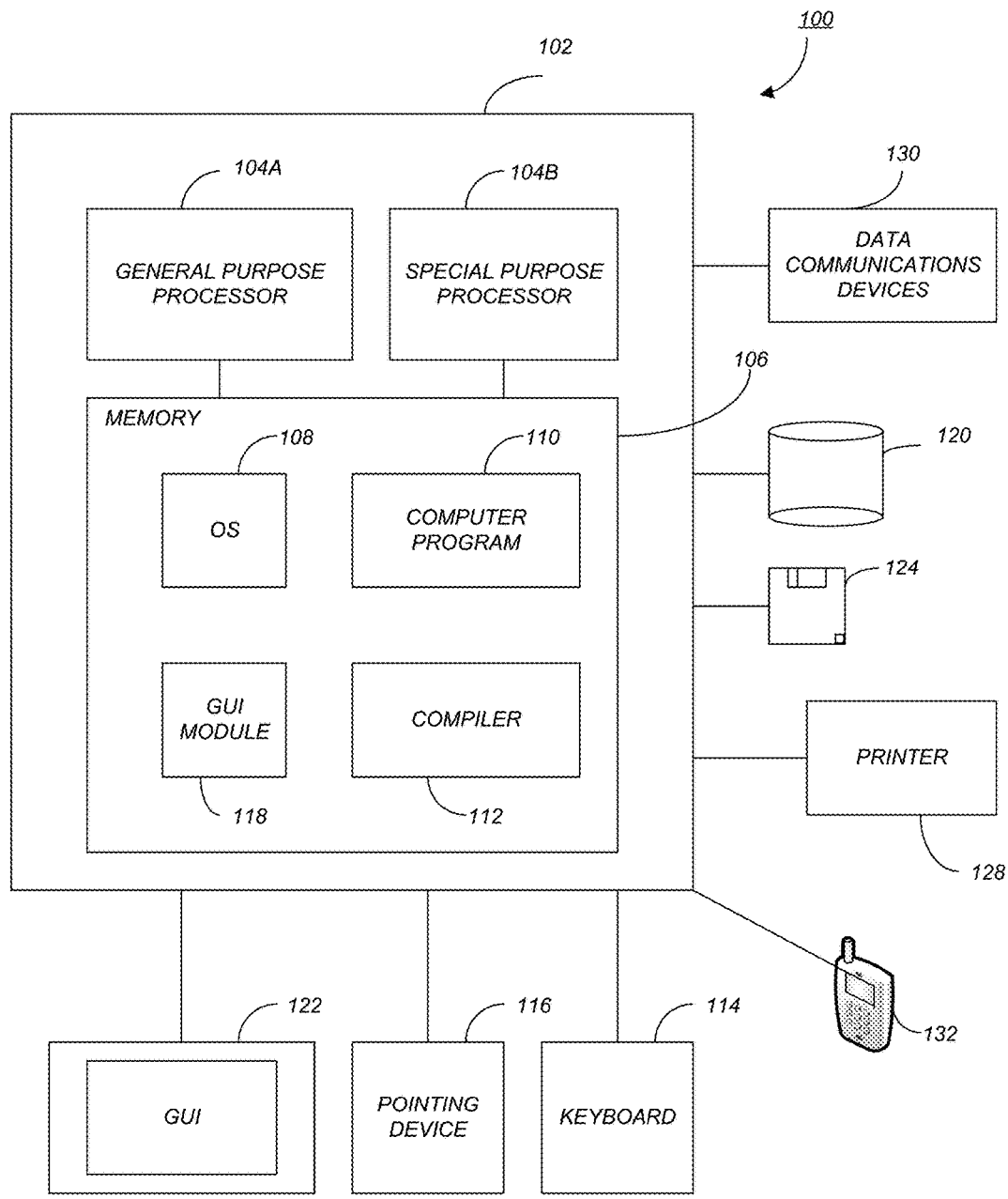
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, iPod™, Nook™, portable digital video player, cellular device, personal digital assistant, etc.). In yet another embodiment, the computer 102 may comprise a multi-touch device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118. Although the GUI module 118 is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program 110 instructions. In one embodiment, the special purpose processor 104B is an application specific integrated circuit (ASIC).

The computer 102 may also implement a compiler 112 that allows an application or computer program 110 written in a programming language such as COBOL, Pascal, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transitory computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program 110 instructions which, when accessed, read and executed by the computer 102, cause the computer 102 to perform the steps necessary to implement and/or use the present invention or to load the program of instructions into a memory 106, thus creating a special purpose data structure causing the computer 102 to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
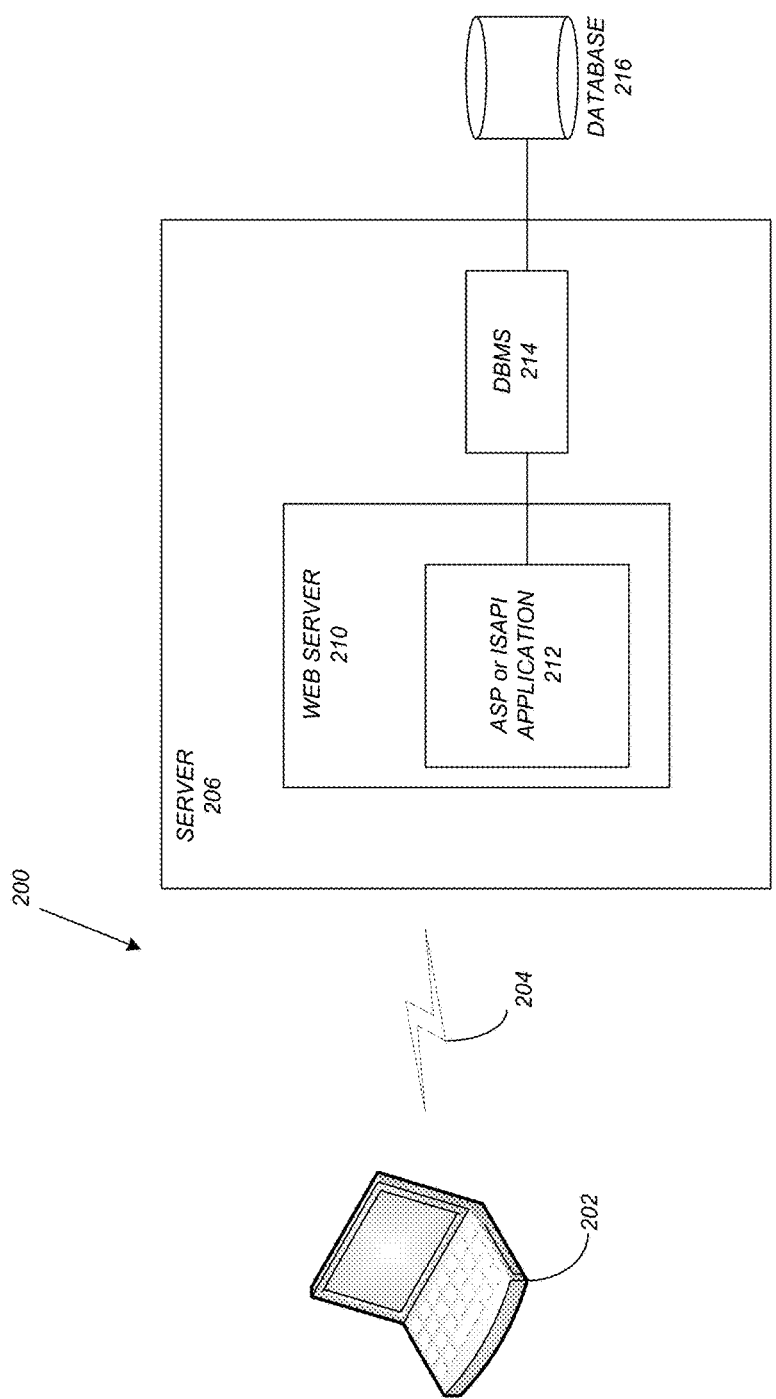
FIG. 2 schematically illustrates a typical distributed computer system using a network to connect client computers to server computers in accordance with one or more embodiments of the invention.

FIG. 2 schematically illustrates a typical distributed computer system 200 using a network 204 to connect client computers 202 to server computers 206. A typical combination of resources may include a network 204 comprising the Internet, LANs (local area networks), WANs (wide area networks), SNA (systems network architecture) networks, or the like, clients 202 that are personal computers or workstations (as set forth in FIG. 1), and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 202 and servers 206 in accordance with embodiments of the invention.

A network 204 such as the Internet connects clients 202 to server computers 206. Network 204 may utilize ethernet, coaxial cable, wireless communications, radio frequency (RF), etc. to connect and provide the communication between clients 202 and servers 206. Clients 202 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, GOOGLE CHROME™, etc. Further, the software executing on clients 202 may be downloaded from server computer 206 to client computers 202 and installed as a plug-in or ACTIVEX™ control of a web browser. Accordingly, clients 202 may utilize ACTIVEX™ components/component object model (COM) or distributed COM (DCOM) components to provide a user interface on a display of client 202. The web server 210 is typically a program such as MICROSOFT'S INTERNET INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 202 instead of communicating/obtaining the information from database 216 across network 204. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 202 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 202 and 206.

Software Implementation Details

Embodiments of the invention are implemented as a software application on a client 202 or server computer 206. Further, as described above, the client 202 or server computer 206 may comprise a thin client device or a portable device that has a multi-touch-based display. Further, the software application may be a computer aided design (CAD) application and/or 3D design application. In particular, embodiments of the invention may be implemented in a 3D civil engineering design system (e.g., AUTOCAD™ CIVIL 3D™) or a 3D civil engineering modeling system (e.g., AUTODESK™ INFRAWORKS™)

As described herein, embodiments of the invention provide the ability to design safe, efficient, and economical interchanges, intersections, and road accessories in context using design rules and enabling integration with services such as drainage, structures, and traffic analysis. Prior art systems required users to manually design such intersections. For example, user designers were required to check the curb return radius value (e.g., in American Association of State Highway and Transportation Officials [AASHTO] Rules/standards), and manually apply such values as parameters when creating an intersection. Thereafter, when any changes to the design occurred due to project need, such design changes could cause the intersection to be adjusted in order to meet standards. Accordingly, the user designers were required to repeat the check process to confirm that the curb return radius complied with the requirements. If the model did not comply, manual changes to the intersection were required. Thus, multiple checks and modifications of an intersection had to be performed manually to ensure compliance with all desirable parameters.

In alternative prior art solutions, intersection types were limited to a single option (e.g., a roundabout) or the user was again required to manually check the curb return value after a model was created. In yet another alternative prior art system, when creating an intersection, three-dimensional aspects of the intersection were created from slices of a section view at stations. Accordingly, a true 3D model of the intersection was not created.

Embodiments of the invention overcome the problems of the prior art, and enable the direct design/creation of a 3D intersection model based on a various rules/parameters, and further automatically update an intersection based on changes in a design (while remaining consistent/in compliance with the rules/parameters). To provide such a design creation, embodiments of the invention examine a set of rules/design conditions relating to the junction (e.g., that may include the roads and/or the vehicles that may utilize the roads/junction) that is going to be designed and offer a solution that is most suitable to the design conditions.

More specifically, when designing an intersection between two or more roads, various criteria/design conditions/rules may require compliance. Such rules may be user defined, based on governmental requirements/regulations, specified as part of a design standard (e.g., AASHTO Rules), automatically created based on various parameters or a combination of parameters (and/or the above conditions), and/or can be extensible. Embodiments of the invention may utilize any and all of such rules when designing/creating an intersection, and maintaining such an intersection throughout the life of the intersection object.

In the case of road design, the rules may represent characteristics of use—outside factors that contribute to the actual shape of the road. In the abstract, the intersection is generated based on several known conditions. The result is the width, angle, lanes, and/or other characteristics of an intersection.

In particular, rules that are input to the system can be based upon one or more parameters that may include the type of vehicle (e.g., the typical vehicle that utilizes the intersection), the angle of the intersection, and or the type of roadway. Additional parameters may also include the number of lanes, how straight the road is, the speed limit, the type of area (e.g., industrial, neighborhood, middle of country, etc.), and/or whether the road is co-located or within a certain distance of a school, hospital, mall, or other relevant structure.

In addition to the parameters specified above, depending on the intersecting road type, rules may be used to determine the correct type of intersection. For example, when two freeways intersect each other, interchanges may be created instead of at grade intersections. Further, if there are multiple choices (e.g., if different types of intersection all satisfy the design requirement), rules may be used to determine which intersection is best, considering land use, construction cost, etc. Further, such information/rules may be maintained and updated.

Logical Flow

Figure 3:
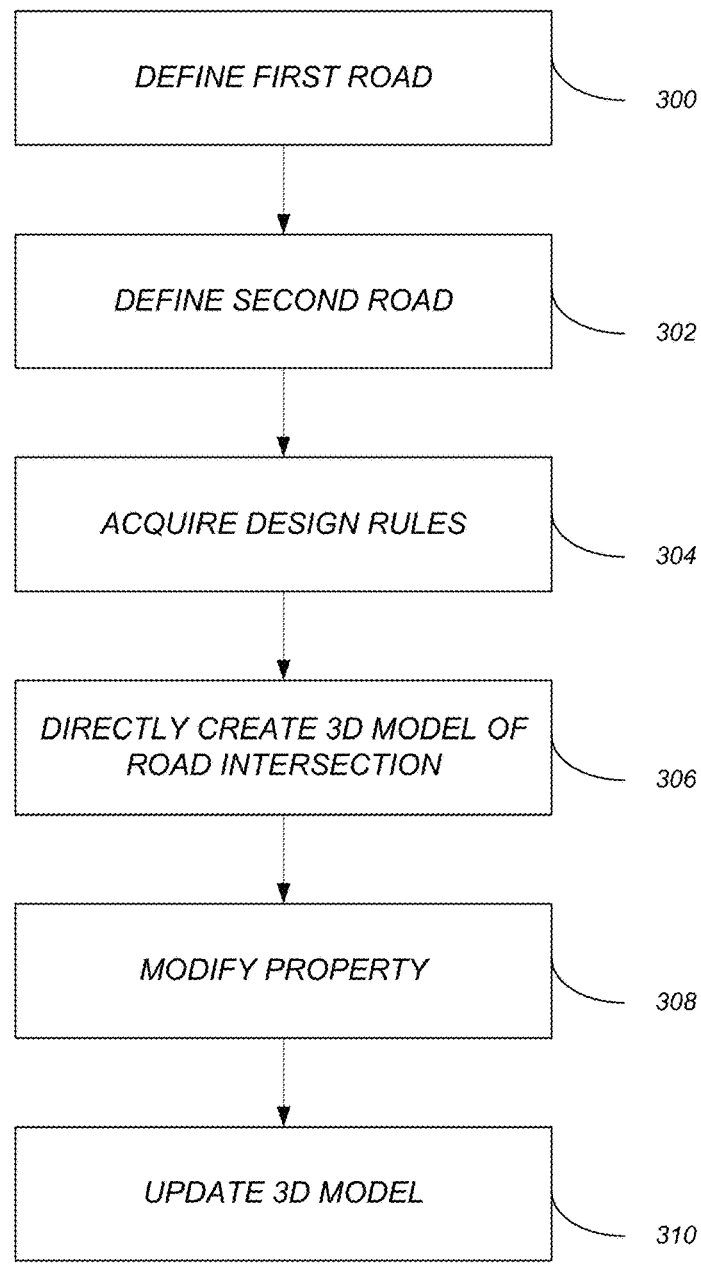
FIG. 3 illustrates the logical flow for designing a junction/road intersection in a 3D modeling and visualization system in accordance with one or more embodiments of the invention.

FIG. 3 illustrates the logical flow for designing a junction/road intersection in a 3D modeling and visualization system in accordance with one or more embodiments of the invention.

At step 300, a first road is defined in the 3D modeling and visualization system.

At step 302, a second road is defined in the system. The second road intersects with the first road.

At step 304, a set of one or more design rules are acquired. The design rules define characteristics of use that contribute to a shape of the road intersection. The design rules may be design standards promulgated by AASHTO. Such rules may be based on a type of vehicle, angle of the road intersection, type of intersection, type of roadway, number of lanes, straightness of the first/second road, a speed limit, a type of area, a geographical proximity to a relevant structure, land use, etc. Further, the design rules may define a layout for the road intersection, may be defined by a user, and may be expandable. In yet additional embodiments, traffic conditions/requirements may be predicted, and used as a parameter/condition/rule.

Exemplary intersection layout based rules may be user specified and/or may be based on promulgated standards. For example, a rule may be based on the through lane layout such that through lanes in an intersection inherit the properties from the road it starts. Other intersection layout based rules may be based on curb return geometry, right turn lane attributes, left turn lane attributes, intersection components, roadside elements, and optimization. For example, the curb return geometry (e.g., widths, length of approach/entry) may be adjusted based on the design vehicle and turn angle table. With respect to right turn lane parameters, a lane may be designated as a right turn lane attribute (e.g., a shared right turn), or as a dedicated right turn only lane (e.g., based on traffic demand). Similarly with respect to left turn lane parameters, a lane may be designated as a shared left turn (e.g., a lane is shared with a left turn lane attribute and thru traffic), or a left turn only lane (e.g., based on traffic demand). Intersection components may contain real-world attributes such as material type, drainage characteristics, etc. Various roadside elements may be automatically placed (e.g., curbs, curb and gutter, sidewalks—top/exposed surfaces, etc.).

At step 306, based on the set of design rules, a 3D model of the road intersection is directly created. The intersection/junction/interchange may be created as an object within an assembly and/or as a re-usable assembly. Rule based intersection components may also be created at step 306. Such components may include a reusable database of various types of intersection accessories. Further, pre-configured intersection components/accessories may be dragged-and-dropped from a component/junction database to an intersection region. In addition to storing/saving an intersection design in a component/junction database, an intersection design may be shared with other users. Thus, for example, based on a selected vehicle type, embodiments of the invention may design an intersection by accessing a rules database for the vehicle, identifying a wheelbase length in the database (e.g., width of the wheels, turn angle/radius, etc.) and determine the width of a lane/curb return that provides sufficient clearance for the vehicle.

At step 308, a property of the first or second road is modified. For example, properties for each individual street/arm/leg may be edited in order to provide a focused and specific configuration. Such editing may include copying/pasting properties from streets/arms/legs in order to avoid duplicated effort and encourage information reuse. Other properties that may be modified include lane number/width, curve geometry of an intersection object, locking some geometry while performing an intersection design, attributes (e.g., types, sizes, and placements of islands and road accessories), angles (e.g., adjusted using a protractor/tool function), the design vehicle, etc.

At step 310, the 3D model of the road intersection is automatically updated (e.g., without additional user input) in a manner consistent with the modified property and in compliance with the set of design rules. In other words, the intersection/intersection object and component relationships (e.g., a curb return radius) are dynamically updated (e.g., in real-time as editing is performed) (e.g., when an intersection or a road is dragged or a design vehicle is changed).

Figure 4:
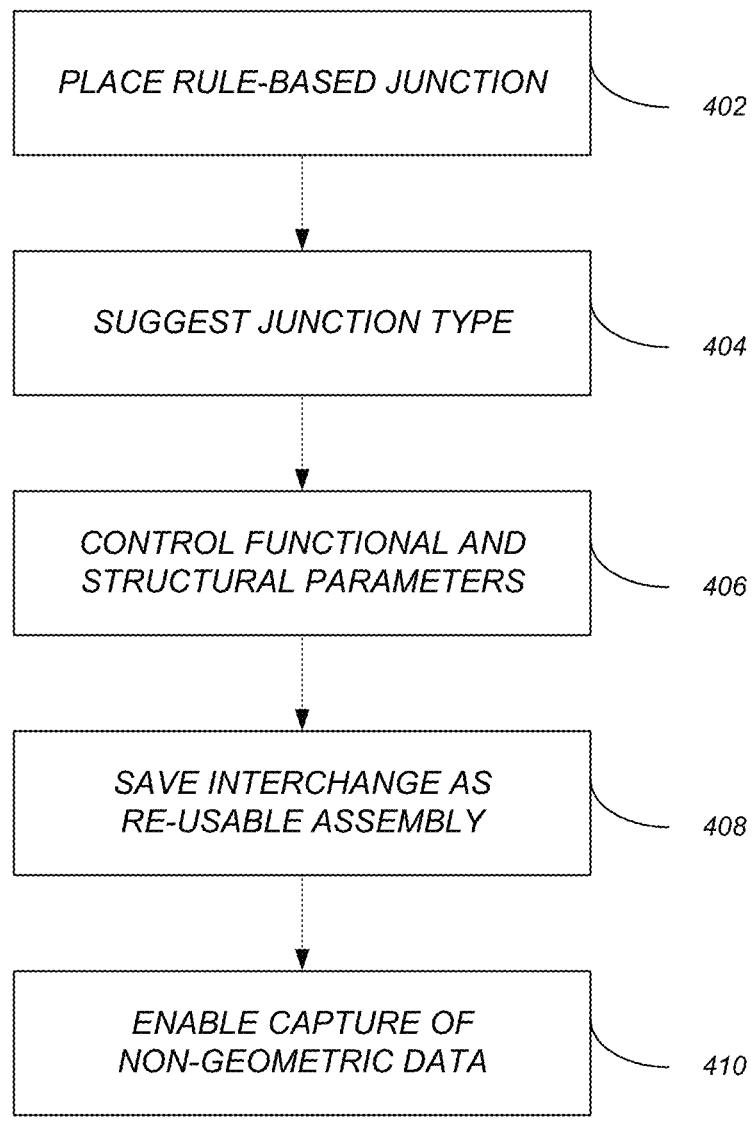
FIG. 4 illustrates an exemplary workflow for designing/creating the road intersection at step 306 of FIG. 3 in accordance with one or more embodiments of the invention.

FIG. 4 illustrates an exemplary workflow for designing/creating the road intersection at step 306 of FIG. 3.

At step 402, a rule-based junction is placed at the location where the first road crosses the second road (i.e., where a road crosses another road model).

At step 404, a junction type is suggested (e.g., to a user via a graphical user interface) based on the context and functional requirements of the junction. Such a junction type may be based on user defined parameters, the set of rules, and/or other factors. For example, an "at grade intersection" (i.e., "at grade" meaning that the roads meet without bridges) may be selected when two collector roads intersect. In this regard, a collector road is a road whose purpose is to move traffic from local roads onto highways/arteries. Such an intersection is in contrast with a local road crossing at a highway which usually will be a "separated grade" junction, using at least one bridge to avoid conflict between the traffic flows.

The solution/suggested junction type may also be optimized. For example, an optimal solution can be offered by varying either posted/design speeds and/or cross slope so that a safer and more economical infrastructure is designed. As a specific example, optimization may include optimization in super-elevation situations of intersection roads (e.g., road warping may result in appropriate super-elevated cross slopes that consider speed). In this regard, in a curve area, super-elevation may be added for a cross slope to achieve higher speed. Further, sometimes due to drainage or economy factors, a normal cross slope for a road may be considered. In such a case, the posed design speed will be needed at the curve area.

At step 406, the functional and structural parameters of the interchange/intersection are controlled (e.g., based on the set of rules and/or the type of intersection selected by the user in response to the suggestion at step 404).

At step 408, the junction/interchange is saved as an object/re-usable assembly.

At step 410, the intersection object/assembly may be enabled/configured to capture non-geometric metadata associated with the intersection.

Figure 5:
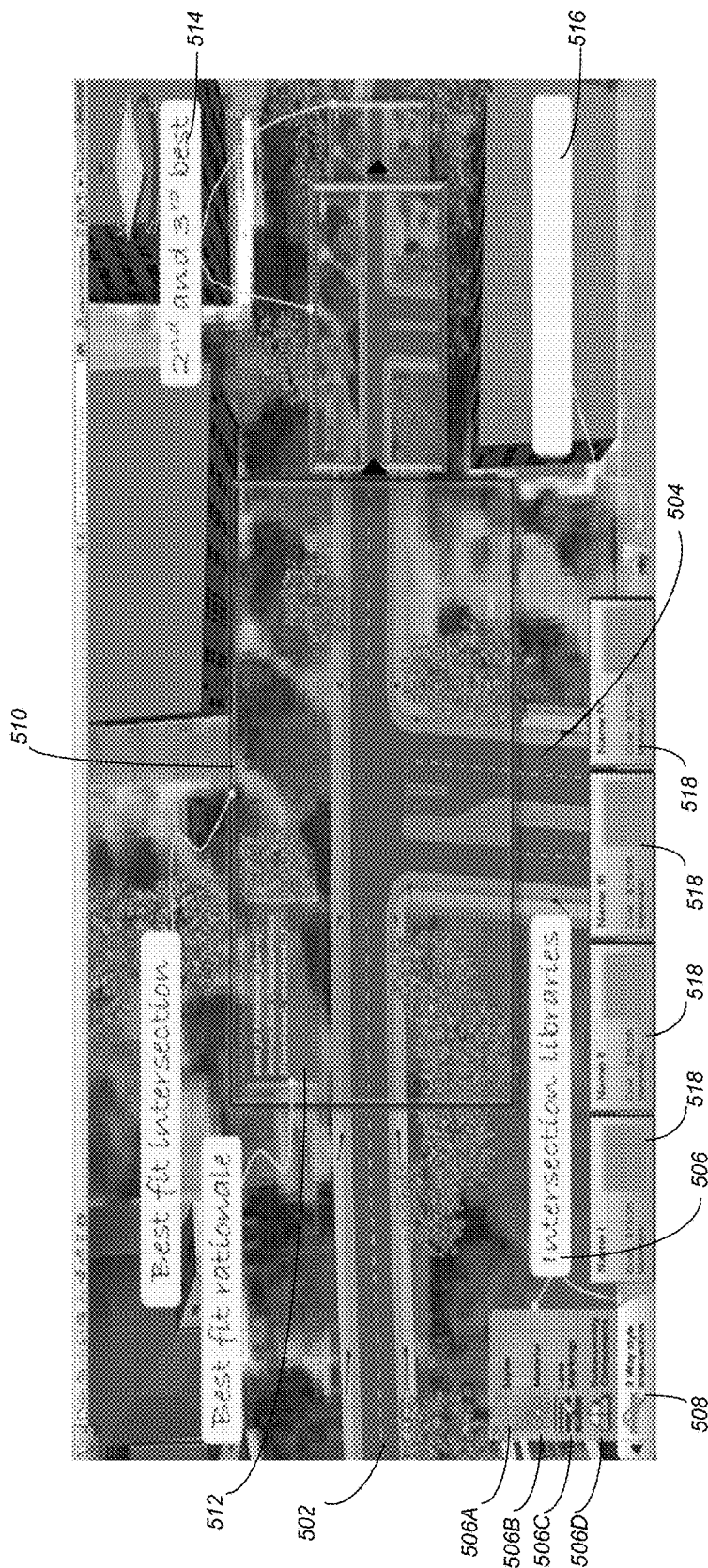
FIG. 5 illustrates an exemplary graphical user interface that may be displayed when designing a road intersection in accordance with one or more embodiments of the invention.

FIG. 5 illustrates an exemplary graphical user interface that may be displayed when designing a road intersection in accordance with one or more embodiments of the invention. Roads 502 and 504 intersect at a given location. Intersection libraries 506 provide different options for the intersection. Options/libraries may include intersection styles 506A, material 506B, lane markings 506C, subassembly components 506D, etc. The currently active intersection style may be displayed in area 508. The best fit intersection 510 is displayed (e.g., automatically based on the rules and context of the intersection) at the intersection of the roads 502 and 504 in a manner that the user can visualize the result. The rationale 512 for why this particular intersection 510 has been selected may also be displayed within the best fit intersection window 510. Alternative/different options 514 for the intersection may also be displayed. Such options 514 may be sorted based on best fit (e.g., consistent with the rules and user selections). Different options may be saved/named (e.g., via input area 516) as re-usable assemblies and presented for easy selection (e.g., via icons 518). In this regard, such reusable assemblies provide pre-configured intersection components/accessories that may be dragged-and-dropped from a component database to the intersection region/area.

Once completed, one or more of the intersection geometry options may be modified by a user (e.g., by selecting a different option 506) and/or by moving a road, a structure (e.g., a tree or house), etc. Thereafter, the system will automatically and without additional user input, update the intersection to accommodate the change while remaining consistent/in compliance/conformance with any rules/standards.

Figure 6:
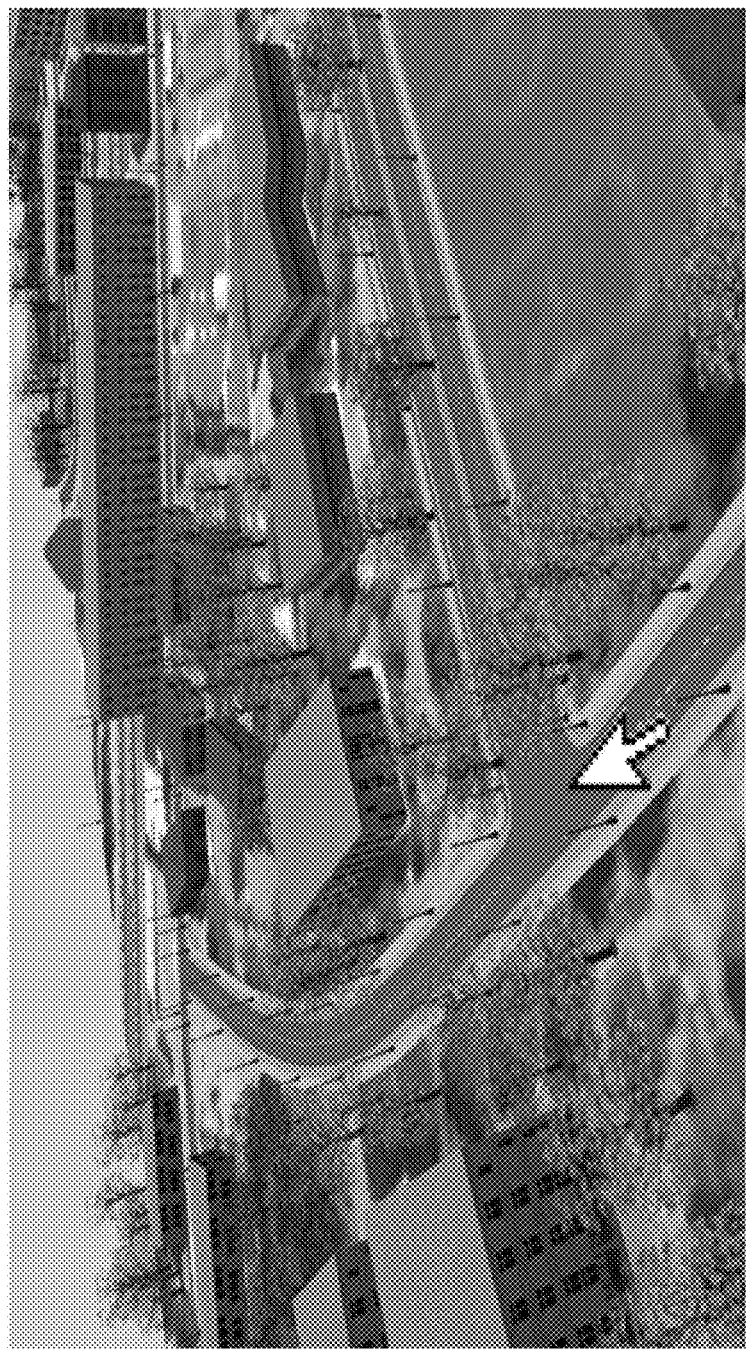
FIG. 6 illustrates a completed intersection model displayed at a different angle/camera view from that of FIG. 5 within the modeling/visualization system in accordance with one or more embodiments of the invention.

FIG. 6 illustrates a completed intersection model displayed at a different angle/camera view from that of FIG. 5 within the modeling/visualization system in accordance with one or more embodiments of the invention.

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

In summary, embodiments of the invention provide for creating intelligent rule-based 3D intersections that meet the requirements of design vehicles (e.g., from standards) at model creation time to improve efficiency and avoid design changes at later stages. In exemplary embodiments, radius values are derived from AASHTO design standards based on key parameters such as the design vehicle and angle of turn of the two intersecting roads. An intersection 3D model that meets design standards is created and dynamically updated when an edit is performed in a parent road's (i.e., one or more of the roads that participate in/comprise the intersection) geometry and/or properties. Further, different intersection types (e.g., roundabout, interchange, intersection) may be selected according to road type (e.g., based on AASHTO standards when performing road network design). In addition to rule based road intersection design, intersection design may utilize 3D model and in-canvas editing via an intuitive and helpful interface.

Thus, embodiments of the invention incorporate and utilize procedural engineering of intersection design by inputting road types, vehicle, turn of angle, intersection type as a whole, etc. to output a design solution in the form of an intersection object that is dynamically updated to conform to the design standards together with design changes performed by the user. Further, a true 3D model of the intersection is built during the design stage rather than a 2D model or interpolated 3D model (e.g., from sections/stages of a model).

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for designing a road intersection in a three-dimensional (3D) modeling and visualization system, comprising:
   defining a first road in the 3D modeling and visualization system;
   defining a second road in the 3D modeling and visualization system, wherein the second road intersects with the first road;
   acquiring a set of one or more design rules that define characteristics of use that contribute to a shape of the road intersection, wherein the one or more design rules are based on a type of vehicle, an angle of the road intersection, and a type of roadway;
   directly creating, based on the set of one or more design rules, a 3D model of the road intersection, wherein the 3D model of the road intersection is a true 3D model and wherein the road intersection further comprises a currently active intersection style;
   displaying the currently active intersection style;
   modifying, via user input, a property of the first road or the second road; and
   automatically, without additional user input, updating the 3D model and display of the road intersection consistent with the modified property and the set of one or more design rules.

2. The computer-implemented method of claim 1, wherein the one or more design rules comprise design standards promulgated by the American Association of State Highway and Transportation Officials (AASHTO).

3. The computer-implemented method of claim 1, wherein the one or more design rules are based on a number of lanes, a straightness of the first road, a speed limit, a type of area, and a geographical proximity to a relevant structure.

4. The computer-implemented method of claim 1, wherein the one or more design rules define a layout for the road intersection.

5. The computer-implemented method of claim 1, wherein the one or more design rules comprise an intersection type.

6. The computer-implemented method of claim 1, wherein the one or more design rules are based on land use.

7. The computer-implemented method of claim 1, wherein the one or more design rules are defined by a user.

8. A non-transitory computer readable storage medium encoded with computer program instructions which when accessed by a computer cause the computer to load the program instructions to a memory therein creating a special purpose data structure causing the computer to operate as a specially programmed computer, executing a method of designing a road intersection in a three-dimensional (3D) modeling and visualization system, comprising:
   defining, in the specially programmed computer within the 3D modeling and visualization system, a first road;
   defining, in the specially programmed computer within the 3D modeling and visualization system, a second road, wherein the second road intersects with the first road;
   acquiring, in the specially programmed computer, a set of one or more design rules that define characteristics of use that contribute to a shape of the road intersection, wherein the one or more design rules are based on a type of vehicle, an angle of the road intersection, and a type of roadway;
   directly creating, in the specially programmed computer, based on the set of one or more design rules, a 3D model of the road intersection, wherein the 3D model of the road intersection is a true 3D model, and wherein the road intersection further comprises a currently active intersection style;
   displaying, in the specially programmed computer, the currently active intersection style;
   modifying, in the specially programmed computer via user input, a property of the first road or the second road; and
   automatically, without additional user input, updating, in and via the specially programmed computer, the 3D model and display of the road intersection consistent with the modified property and the set of one or more design rules.

9. The non-transitory computer readable storage medium of claim 8, wherein the one or more design rules comprise design standards promulgated by the American Association of State Highway and Transportation Officials (AASHTO).

10. The non-transitory computer readable storage medium of claim 8, wherein the one or more design rules are based on a number of lanes, a straightness of the first road, a speed limit, a type of area, and a geographical proximity to a relevant structure.

11. The non-transitory computer readable storage medium of claim 8, wherein the one or more design rules define a layout for the road intersection.

12. The non-transitory computer readable storage medium of claim 8, wherein the one or more design rules comprise an intersection type.

13. The non-transitory computer readable storage medium of claim 8, wherein the one or more design rules are based on land use.

14. The non-transitory computer readable storage medium of claim 8, wherein the one or more design rules are defined by a user.

* * * * *